United States Patent [19]

Silk et al.

[11] 4,242,588
[45] Dec. 30, 1980

[54] X-RAY LITHOGRAPHY SYSTEM HAVING COLLIMATING OPTICS

[75] Inventors: John K. Silk, Wellesley; Allen S. Krieger, Lexington; Eugene W. C. Huang, Lynnfield, all of Mass.

[73] Assignee: American Science and Engineering, Inc., Cambridge, Mass.

[21] Appl. No.: 66,140

[22] Filed: Aug. 13, 1979

[51] Int. Cl.³ ............................................. G21K 5/00
[52] U.S. Cl. ............................... 250/492 A; 250/272; 250/280; 250/505
[58] Field of Search ............... 250/272, 273, 276, 280, 250/492 R, 492 A, 505

[56] References Cited

U.S. PATENT DOCUMENTS 4,028,547  6/1977  Eisenberger .................... 250/272

OTHER PUBLICATIONS

"Ultrafine Line Projection System", Feder and Rosenberg, IBM Technical Disclosure Bulletin, V 16, No. 9, Feb. 1974, pp. 3121-3122.

Primary Examiner—Craig E. Church

Attorney, Agent, or Firm—Pollock, Vande Sande and Priddy

[57] ABSTRACT

An X-ray lithography system for the production of micro-electronic circuits, of the type comprising a mask having detailed circuit patterns thereon which are irradiated by soft X-rays onto a wafer covered with a photosensitive material to replicate the mask patterns, includes an X-ray source spaced from the mask and operative to produce a plurality of input beams of X-rays which are substantially collimated by an array of grazing incidence mirrors to produce a plurality of output X-ray beams which are spaced from one another at the output of the collimator and which are projected in substantially parallel relation to one another toward the mask. Each output beam exhibits a small divergence which causes the several output beams to merge into a single, comparatively large cross-sectional area, composite beam of X-rays at a plane spaced from the collimator. The mask is positioned substantially in said plane for illumination by the composite beam of X-rays. Filters are provided, preferably in the region between the mask and the collimator, for adjusting the spatial uniformity and spectrum of the composite beam.

13 Claims, 2 Drawing Figures

X-RAY LITHOGRAPHY SYSTEM HAVING COLLIMATING OPTICS

BACKGROUND OF THE INVENTION

The present invention is concerned with an improved X-ray lithography system which is adapted to replicate submicron mask patterns by proximity focusing soft X-rays on a photosensitive material to produce microelectronic circuits, and is more particularly concerned with such a system which is capable of producing finer scale patterns than are possible with the visible light lithographic processes now widely used in the semiconductor industry, and which is capable of achieving higher LSI circuit functional densities than have been produced by X-ray lithography systems suggested heretofore, by reducing the effects of geometric distortion and nonuniform illumination. These improved results are achieved by employing in the system a grazing incidence optical system which produces substantially collimated X-rays that eliminate geometric distortions of the pattern that would result if uncollimated beams were employed. The device of the present invention provides advantages additional to collimation, e.g., the ability to illuminate large patterns several centimeters square, and to do so with good uniformity and high efficiency. The system has applications to X-ray shadow microscopy as well as lithography.

The method currently employed in the industry for the fabrication of electronic and optical microdevices by microfabrication techniques, wherein detailed circuit patterns on a mask are irradiated onto a silicon wafer that is covered with a photosensitive material, is to employ, as the irradiating source, visible/ultraviolet light (on the order of 4,000 Å wavelength). Two approaches are normally used in such known lithography systems, i.e., proximity printing and projection printing. The minimum line widths achieved in commercial systems are about 2.5 to 3.5 micrometers, although finer lines, e.g., about 0.7 micrometers in width, have been achieved in laboratory arrangements. As integrated circuit technology advances, there is a need for higher-density IC's, more complex structures with more elements, finer line widths and smaller feature spacing. One attempting to meet these requirements with visible light lithography encounters fundamental limitations resulting from diffraction, and also encounters substantially increased costs.

X-ray lithography, wherein soft X-rays are substituted for visible or ultraviolet radiation, has been suggested as a submicrometer lithographic technique that is potentially high in throughput and relatively inexpensive. Such X-ray lithography systems constitute, at the present time, a laboratory development. X-rays of 4–50 Å wavelength are used to print replicas of gold mesh patterns, or electron-beam generated masks, on photosensitive materials. Various illumination schemes have been employed in these laboratory X-ray lithography systems.

To achieve best results in an X-ray lithography system, it is desirable to employ a collimated beam of X-rays to avoid geometrical spreading and distortion effects which would occur if rays were to pass through the mask at nonnormal angles and follow slanted paths to the photosensitive material on the wafer. The most common approach used heretofore in an effort to achieve such collimation has been to place a spatially small, fairly conventional (i.e., electron beam/anode) source of X-rays at a comparatively large distance from the mask/wafer, the source distance being made sufficiently large (e.g., 50 centimeters) to achieve partial collimation. In such arrangements, the mask-wafer separation is made small (e.g., 40 micrometers). Lines as narrow as 0.16 micrometer have been achieved but, more typically, lines of 1 micrometer width are produced over a wafer of several centimeters in dimension.

Systems of the type described above tend to be relatively inefficient since good collimation requires a comparatively large source-to-mask distance. Since the flux incident on the mask falls off as the inverse square of the source-to-mask distance, only a very small fraction of the source output is actually used.

Other types of system have been suggested in an effort to avoid geometrical spreading and distortion effects. One such alternative system suggested heretofore employs contact focusing, which allows good resolution over several centimeters with an extended (hence high power) source. Such contact focusing systems, employed in laboratories at the present time, will in all probability not be suited to production work because of mask damage.

Another system which has been suggested is to use, in place of a conventional X-ray source, an unconventional source such as a pulsed laser plasma. Such a source has been suggested since it tends to reduce the exposure time by taking advantage of the flux and spectrum available from this type of source. The collimation problem is, however, the same as that for a conventional source, and a parallel beam is obtained only at a substantial distance from the source and at a corresponding penalty in flux.

Another variation which has been suggested heretofore is to employ synchrotron radiation. Such radiation is intense, collimated, and has a favorable continuous spectrum. A major disadvantage of this approach, however, is the comparatively high capital cost of a synchrotron facility; the necessary investment is such that only a small number of synchrotron laboratories exist, and hence a microelectronics manufacturer would be obliged to share a facility with other users, including competing firms. A secondary disadvantage of synchrotron sources is the nonuniform illumination in the beam, which limits the area over which it is possible to print with optimum exposure.

The present invention is intended to obviate these disadvantages of the prior art, and to provide an X-ray lithography system which is relatively inexpensive but which is nevertheless capable of achieving the production of finer scale patterns and higher-density IC's than can be achieved by visible/ultraviolet light and/or X-ray lithography systems used heretofore.

SUMMARY OF THE INVENTION

The X-ray lithography system of the present invention is operative to produce a comparatively large cross-sectional beam of substantially collimated X-rays at a mask by use of an X-ray source which is disposed closer to the mask than has been conventional heretofore, and which achieves the desired collimation by interposing an array of grazing incidence mirrors between the source and mask to approximately collimate soft X-rays from the source. The source operates to produce a plurality of input beams which are directed toward the collimator of the present invention at sufficiently small grazing angles to cause the X-rays in each input beam to be totally externally reflected by the mirrors. In certain applications of the invention, e.g., in the manufacture of one dimensional gratings, a single set of mirrors collimating in one plane only gives acceptable results. However, in those applications of the invention where collimation in two planes is desirable or necessary, the array of mirrors comprises for each input beam at least two of said mirrors which are disposed orthogonal to one another and which operate to collimate each input beam in two mutually orthogonal planes by successive reflections of the said input beam by said two mirrors.

The array of grazing incidence mirrors produces a plurality of output X-ray beams which are spaced from one another at the output of the collimator, and which are projected in substantially parallel relation to one another toward the mask. Each of the output beams exhibits a small divergence (on the order of a few arc min.) whereby the gaps between the several output beams decrease with increasing distance from the output of the collimator. The small divergence of the several output beams cause the beams to merge into a single comparatively large cross-sectional area, composite beam of X-rays at a plane which is spaced from the collimator, and the mask is positioned substantially in that plane for illumination by the merged, composite beam of X-rays.

In the preferred embodiment of the invention, an aperture plate is disposed between the collimator and mask in the paths of the output beams, and a plurality of filters are mounted on the aperture plate to adjust the spatial uniformity of the output beams and the spectrum of each output beam. The filters should preferably be positioned between the collimator and mask to eliminate scattering effects. The filter means can be so arranged as to produce a substantially constant level of illumination across the cross sectional area of the composite beam at the mask location or, if desired, the filters can be arranged to provide different levels of intensity at different cross-sectional portions of the composite beam to achieve different exposures at different parts of the photosensitive wafer.

The use of grazing incidence mirrors has been suggested heretofore in nonanalogous applications, e.g., arrays of such mirrors have been used in X-ray telescopes, working in a direction which is the reverse of that employed in the instant application, to bring collimated X-rays from a small extremely distant source to a point focus. Such optics have also been suggested for use in other imaging systems, such as X-ray microscopes. The design of the optics, and the types of system in which such optics have been used heretofore, are discussed, for example, in L. P. VanSpeybroeck, R. C. Chase, and T. F. Zehnpfennig, ""Orthogonal Mirror Telescopes for X-ray Astronomy", Applied Optics, Vol. 10, p. 945, April, 1971; P. Gorenstein, H. Gursky, F. R. Harnden, Jr., A. Decaprio, and P. Bjorkholm "Large Area Soft X-ray Imaging System for Cosmic X-ray Studies from Rockets", Institute of Electrical and Electronics Engineers Transactions on Nuclear Science, Vol. NS-22, 1975; F. D. Seward and T. M. Palmieri, "A Simple X-ray Microscope for Photographing Laser Produced Plasmas", Review of Scientific Instruments, Vol. 46, p. 204, February 1975; J. H. Underwood and D. Turner, "Bent Glass Optics", Proceedings of the Society of Photo-Optical Instrumentation Engineers, Vol. 106, p. 125, April 1977; and Eugene W. C. Huang, R. E. Cabral, R. E. Brisette, "A Method of Obtaining a Parabolic Reflecting Surface from Thin Float Glass Plate and its Application to the LAMAR X-ray Telescope", Proceedings of the Society of Photo-Optical Instrumentation Engineers, Vol. 184, May, 1979. Orthogonal mirror X-ray optics used as a collimator has not, however, been suggested heretofore for use in conjunction with X-ray lithography systems employed in the production of microelectronic circuits, and such a lithography system employing such optics represents a significant advance over the types of lithography systems which have been employed heretofore.

BRIEF DESCRIPTION OF THE DRAWINGS

The foregoing objects, advantages, construction and operation of the present invention will become more readily apparent from the following description and accompanying drawings wherein.

DESCRIPTION OF THE PREFERRED EMBODIMENT

The X-ray lithography system of the present invention employs, as described previously, an array of grazing incidence mirrors which approximately collimates soft X-rays from a source. The operation of such a collimating means depends on the fact that at soft X-ray wavelengths, the real part of the index of refraction is less than 1 so that rays striking a smooth surface at sufficiently small grazing angles are totally externally reflected. Thus a mirror in the form of a paraboloid of translation, illuminated at grazing incidence with X-rays from a source located at a point on its focal line, produces a beam that is collimated in one direction. Such a beam, collimated in one plane only, is useful in certain applications of the present invention as discussed previously. However, aberrations severely limit the performance of a single grazing incidence mirror, and it has therefore been suggested heretofore that a second mirror, orthogonal to the first, be used to reduce the aberrations to an acceptable level.

Figure 1:
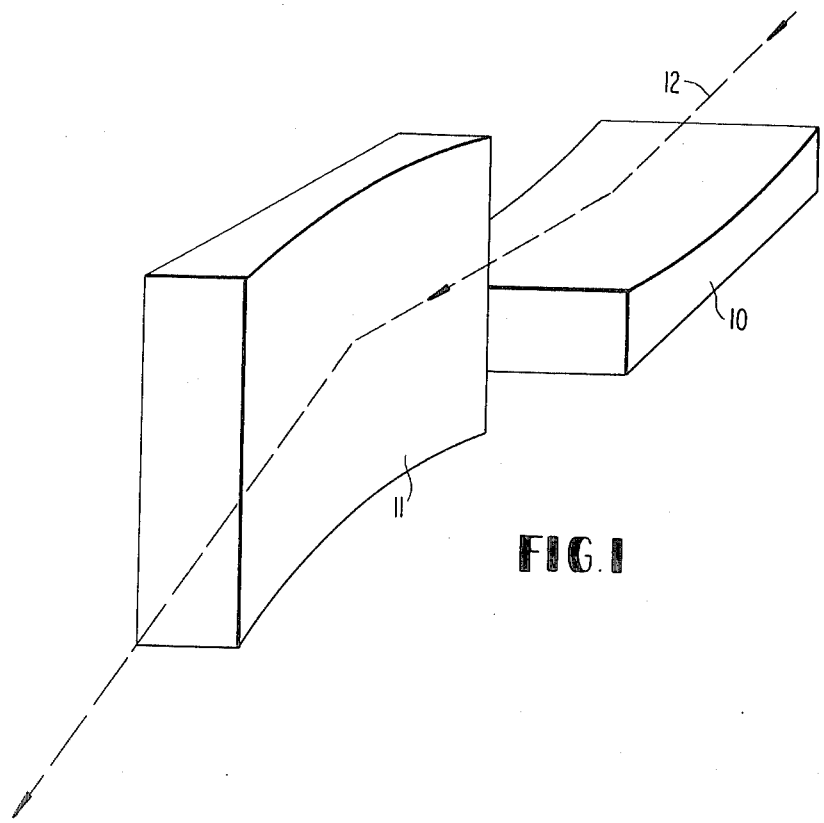
FIG. 1 is a diagrammatic illustration of a pair of orthogonal grazing incidence mirrors such as may be employed in an X-ray lithography system constructed in accordance with the present invention.

The operation of a two-reflection mirror system is illustrated schematically in FIG. 1. The two mirrors are designated, respectively, 10 and 11 and comprise almost flat mirrors which are mounted in tandem so that incoming rays of radiation, such as 12, striking the surface of mirror 10 at a sufficiently small grazing angle, are reflected by said mirror 10 to achieve vertical collimation whereafter the vertically collimated rays are reflected by the surface of mirror 11 to effect horizontal collimation of the rays. The mirrors are produced as thin, smooth sheets of initially flat glass which are bent to form approximate paraboloids of translation by applying calculated couples of force. The physical size of the optics is tractable. When employed in an X-ray lithography system of the preferred type contemplated by the present invention and to be discussed hereinafter in reference to FIG. 2, the glass pieces 10, 11 are in the order of 5–10 centimeters long, 1–3 centimeters wide, and 0.1 centimeters thick, and have a focal length of 10-30 centimeters. These dimensions are, however, merely illustrative, and considerable flexibility can be exercised in scaling the size of the glass pieces to fit a given application.

A single pair of mirrors produces a collimated beam of small cross-section, on the order of 2 mm×2 mm. An array of mirror pairs, for example two vertical collimators and two horizontal collimators, produces an array of focused beams. In the system depicted in FIG. 2, which will be described in further detail hereinafter, four such beams are provided.

A perfectly collimated beam of X-rays would be produced by an array of perfect mirrors illuminated by a point source. Perfect collimation is not achieved in practice, however, nor is it needed for good X-ray lithography. If, for example, a one micrometer transparent feature in a mask is to be replicated lithographically, a 0.1 micrometer spread in the illumination pattern due to imperfect collimation is acceptable. For a typical separation between the mask and the photosensitive material of 40 micrometers, this amount of spread corresponds to a beam divergence of 9 arc min., neglecting any other causes of spread. This beam divergence is well within the capabilities of the grazing incidence optics used in the invention. However better collimation for smaller line widths is also possible.

Figure 2:
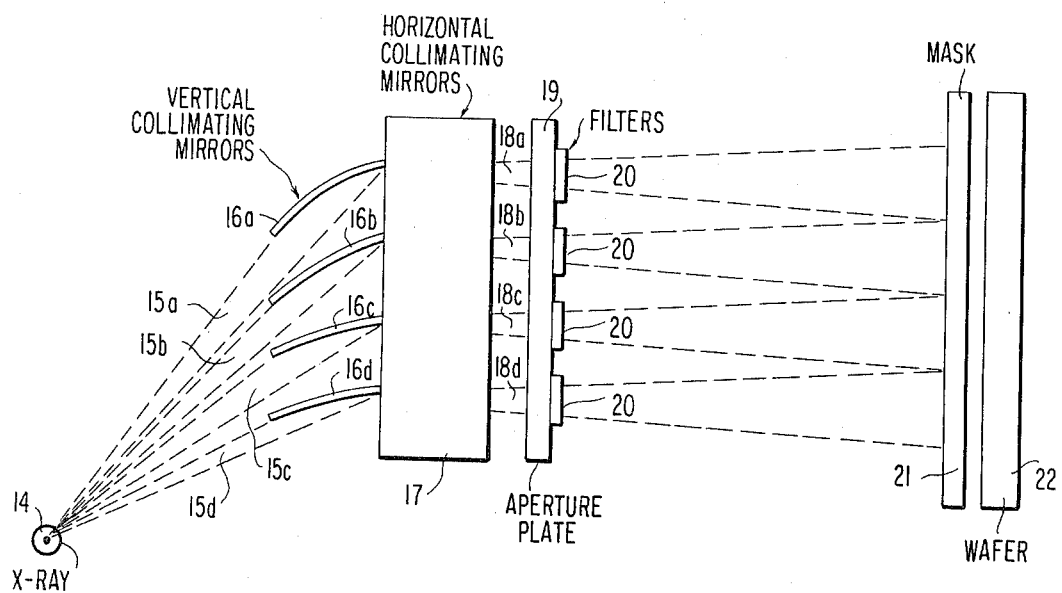
FIG. 2 is a diagrammatic illustration of an X-ray lithography system constructed in accordance with a preferred embodiment of the present invention and employing an array of grazing incidence mirrors operative to produce an array of nearly collimated X-ray beams which illuminate a lithographic mask and photosensitive wafer.

One of the features of the present invention, clearly depicted in FIG. 2, is that nearly collimated beams can be used to produce a single large illumination pattern. If the collimating means consisting of an array of orthogonal mirror pairs is adjusted to produce an array of output beams, each with a small divergence, then as one moves away from the collimating means the individual beams will spread. The separation between the centers of adjacent beams will not change if the mirror units are placed such that their optical axes are parallel. At some distance from the collimator the gap between adjacent beams shrinks to zero, and the array of beams merges at that point to form a single composite beam. If a lithographic mask and photosensitive wafer are positioned in the plane of the merger, they will be irradiated with a large-scale beam of X-rays with small divergence, and each point on the mask will be illuminated. For example, if the beam divergence is 9 arc min., each beam is 2 mm×2 mm in cross section at the collimating means, and the center to center separation of the beams is 4 mm, then the several beams will merge at a distance approximately 40 cm. from the collimating means output.

The foregoing considerations will become more readily apparent by reference to the schematic diagram of the system shown in FIG. 2. The system comprises a conventional spatially small X-ray source 14 which emits radiation into a plurality of input beams 15a-15d. The illustration of four such input beams in FIG. 2 is, of course, given by way of example only. The several beams are directed respectively onto a corresponding plurality of vertical collimators comprising mirrors 16a-16d each of which comprises a mirror of the type designated 10 in FIG. 1, and the rays reflected from said mirrors 16a-16d are then further reflected by horizontal collimating mirrors 17 which comprise an array of further mirrors disposed orthogonal to the mirrors 16a-16d respectively and corresponding, individually, to the mirror 11 shown in FIG. 1. The rays from source 14 accordingly experience two reflections, one approximately collimating them in the vertical direction and the other in the horizontal direction, thereby producing at the output of the collimating means a plurality of output beams 18a-18d.

The several output beams pass through an aperture plate 19 which blocks unwanted rays and on which are mounted filters 20 which adjust the intensity and the spectrum of each output beam. The filters 20 can take the form of thin films or foils disposed over the input or output apertures of the cells in aperture plate 19, and these filters, by filtering each mirror unit individually, control the uniformity of illumination which is produced. This technique can be used to minimize differences between one unit and another or, if desired, can be employed to set up deliberately nonuniform conditions if different exposures are desired on different parts of the photosensitive wafer.

As noted previously, and as depicted in broken line in FIG. 2, the several output beams 18a-18d each exhibit a small divergence, and this divergence of the beams causes them to spread as they move away from the collimator optics so that, at a certain plane, the output beams merge to form a single uniform illumination beam. A lithographic mask 21 and photosensitive wafer 22 are positioned in this plane of beam merger, and are illuminated with the nearly collimated X-rays which are produced by the device.

Typical dimensions for the collimating mirrors, for the output beam cross-sectional dimensions, spacing, and divergence, and for the spacing between the output of the collimating means and the plane of the mask-/wafer combination have been given above, and are applicable to the arrangement shown in FIG. 2.

The collimating system shown in FIG. 2 is geometrically more efficient than the X-ray lithography systems suggested heretofore wherein collimation of the X-ray radiation is attempted by locating a spatially small X-ray source distant from the lithographic mask. In this prior art system, good collimation requires a large source-to-mask distance, e.g., almost 4 meters to obtain 9 arc min. divergence over a 1 cm×1 cm area using a point source; and since, as mentioned previously, the flux incident on the mask falls off as the inverse square of the source-to-mask distance, only a very small fraction of the source output is used in the prior art systems. On the other hand, the collimating means shown in FIG. 2 can be located quite close to the source (e.g., 10-20 cm), and the flux at its input aperture is therefore much larger than the flux would be at a lithographic mask 4 meters away. There are, of course, losses at the collimating means due to finite mirror thickness and other effects, and there are other losses as the rays are collimated due to imperfect reflection and mirror surfaces. The amount of these losses depends on the details of the collimator design and fabrication, but experience and preliminary calculations indicate that these losses are significantly less important than the geometric advantage that the collimating system enjoys.

Masks and filters, e.g., filters of the type generally depicted in FIG. 2, can be used to correct for differences from one mirror to another. Some of these differences are systematic. In particular, the grazing angle is larger for the mirrors further from the axis, and this implies systematic changes in the reflection efficiency and the projected frontal area as one moves to the outer mirror units. Other differences from one mirror to another are more nearly random, e.g., due to variations in the characteristics of the glass; such random differences can be controlled by glass selection and by fine tuning the applied forces. In the preferred embodiment of the invention, the aperture plate and/or filters are positioned as illustrated, i.e., between the collimator and lithographic mask 21. However, it is also possible to position the aperture plate and/or filters between the X-ray source 14 and the collimating optics. This latter arrangement is less desirable, however, since although an aperture plate located before a mirror will block "no-bounce" and "one-bounce" rays, it will not stop scattered rays due to surface irregularities in the glass of the mirror.

While we have thus described a preferred embodiment of the present invention, many variations will be apparent to those skilled in the art. It must therefore be understood that the foregoing description is intended to be illustrative only and not limitative of the present invention, and all such variations and modifications as are in accord with the principles described are meant to fall within the scope of the appended claims.

Having thus described our invention we claim:

1. In an X-ray lithography system for the production of microelectronic circuits, of the type comprising a wafer that is covered with a photosensitive material, and a mask disposed adjacent said wafer and having detailed circuit patterns thereon which are irradiated onto said wafer by soft X-rays thereby to replicate said mask patterns, the improvement wherein said soft X-rays are produced in said system by X-ray illumination means operative to produce a beam of substantially collimated X-rays at said mask, said illumination means comprising an X-ray source spaced from said mask and operative to produce a plurality of input beams of X-rays, means for collimating said input X-ray beams, said collimating means comprising an array of grazing incidence mirrors located between said source and said mask and positioned relative to said input beams at sufficiently small grazing angles to cause the X-rays in each input beam to be totally externally reflected by said mirrors, whereby said array of grazing incidence mirrors produces a plurality of output X-ray beams which are spaced from one another at the output of said collimating means and which are projected in substantially parallel relation to one another from the output of said collimating means toward said mask, each of said output beams exhibiting a small divergence operative to cause the gap between said output beams to decrease with increasing distance from said collimating means and operative to cause said output beams to merge into a single, comparatively large cross-sectional area, composite beam of X-rays at a plane spaced from said collimating means, said mask being positioned substantially in said plane for illumination by said composite beam of X-rays.

2. The system of claim 1 wherein said array of mirrors comprises, for each of said input beams, at least two of said mirrors disposed orthogonal to one another and operative to collimate each input beam in two mutually orthogonal planes respectively by successive reflections of said input beam by said two mirrors.

3. The system of claim 2 wherein said array of grazing incidence mirrors comprises a first plurality of horizontally disposed mirrors, and a second plurality of vertically disposed mirrors positioned adjacent said first plurality of mirrors, said two pluralities being disposed in tandem so that X-rays reflected off a mirror in one of said two pluralities is thereafter reflected by another mirror in the other of said two pluralities.

4. The system of claim 2 wherein each of said mirrors comprises a paraboloid of translation which is illuminated at grazing incidence with X-rays from a source located at a point on the focal line of said mirror.

5. The system of claim 1 including filter means disposed in the paths of said output beams for adjusting the spatial uniformity of said composite beam.

6. The system of claim 5 including an aperture plate disposed between said collimating means and said mask in the paths of said output beams, said filter means comprising a plurality of filters mounted on said aperture plate.

7. The system of claim 5 wherein said filter means is operative to produce different levels of intensity at different cross-sectional portions of said composite beam to effect different exposures at different parts of said photosensitive wafer.

8. The system of claim 5 wherein said filter means is operative to produce uniform levels of intensity at all cross-sectional portions of said composite beam to effect uniform exposure on all parts of said photosensitive water.

9. The system of claim 5 wherein said filter means is operative to adjust the spectrum of each output beam.

10. The system of claim 2 wherein each of said output beams exhibits a cross sectional of substantially 2 mm×2 mm at the output of said collimating means.

11. The system of claim 10 wherein each of said output beams exhibits a beam divergence of substantially 9 arc min.

12. The system of claim 11 wherein the center to center separation of said output beams at the output of said collimating means is substantially 4 mm., said mask being positioned at a distance of substantially 40 cm. from the output of said collimating means.

13. The system of claim 1 including an aperture plate disposed between said X-ray source and said collimating means in the paths of said input beams, and a plurality of filters mounted on said aperture plate.

* * * * *